(12) United States Patent
Murakoshi et al.

(10) Patent No.: US 9,064,902 B2
(45) Date of Patent: Jun. 23, 2015

(54) SEMICONDUCTOR MEMORY DEVICE AND METHOD FOR MANUFACTURING SAME

(71) Applicant: Kabushiki Kaisha Toshiba, Minato-ku (JP)

(72) Inventors: Atsushi Murakoshi, Kanagawa-ken (JP); Daisuke Matsushita, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 75 days.

(21) Appl. No.: 13/939,351

(22) Filed: Jul. 11, 2013

(65) Prior Publication Data

US 2014/0239373 A1  Aug. 28, 2014

Related U.S. Application Data

(60) Provisional application No. 61/770,018, filed on Feb. 27, 2013.

(51) Int. Cl.
  *H01L 29/792* (2006.01)
  *H01L 29/66* (2006.01)
  *H01L 27/115* (2006.01)

(52) U.S. Cl.
  CPC ..... *H01L 29/66825* (2013.01); *H01L 27/11563* (2013.01); *H01L 29/792* (2013.01); *H01L 29/66833* (2013.01); *H01L 27/11521* (2013.01)

(58) Field of Classification Search
None
See application file for complete search history.

(56) References Cited

U.S. PATENT DOCUMENTS

| | | | |
|---|---|---|---|
| 5,796,166 A * | 8/1998 | Agnello et al. | 257/751 |
| 7,067,871 B2 | 6/2006 | Ozawa | |
| 7,585,756 B2 * | 9/2009 | Nam et al. | 438/592 |
| 7,989,871 B2 * | 8/2011 | Yasuda | 257/316 |
| 8,013,380 B2 | 9/2011 | Nakasaki et al. | |
| 8,199,560 B2 * | 6/2012 | Kakoschke et al. | 365/156 |
| 8,470,670 B2 * | 6/2013 | Power et al. | 438/267 |
| 8,501,610 B2 * | 8/2013 | Lin et al. | 438/594 |
| 8,835,248 B2 * | 9/2014 | Takeguchi | 438/242 |
| 2012/0187469 A1 | 7/2012 | Sekine et al. | |
| 2012/0326314 A1 * | 12/2012 | Brown et al. | 257/761 |

\* cited by examiner

*Primary Examiner* — Benjamin Sandvik
(74) *Attorney, Agent, or Firm* — Oblon, McClelland, Maier & Neustadt, L.L.P.

(57) ABSTRACT

According to one embodiment, a semiconductor memory device includes a semiconductor member, a first insulating layer provided on the semiconductor member, a TaN layer provided on the first insulating layer and containing tantalum and nitrogen, a TaSiN layer provided on the TaN layer in contact with the TaN layer and containing tantalum, silicon, and nitrogen, a second insulating layer provided on the TaSiN layer in contact with the TaSiN layer and containing oxygen, and a control electrode provided on the second insulating layer.

17 Claims, 13 Drawing Sheets

FIG. 5A
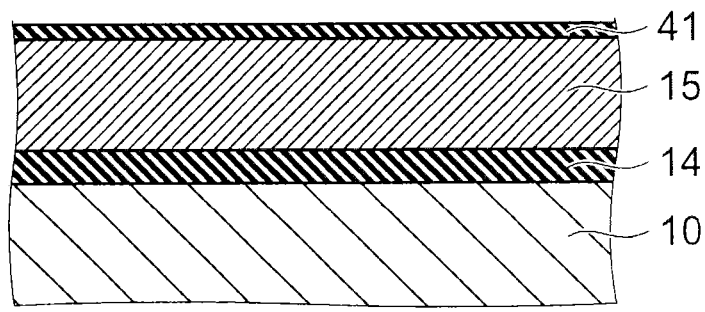
FIG. 5B
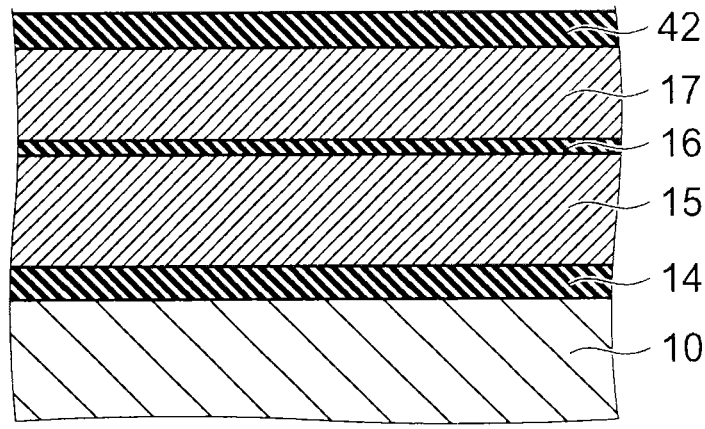

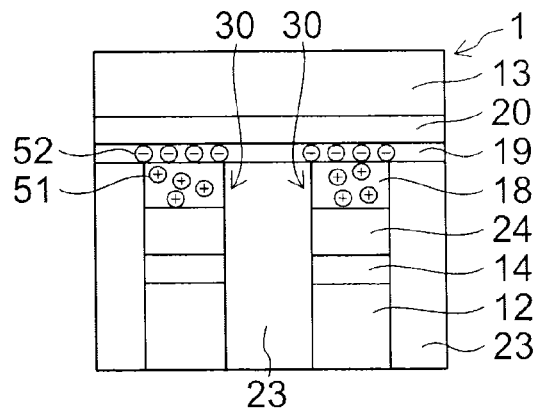
FIG. 8A  NON-OPERATING
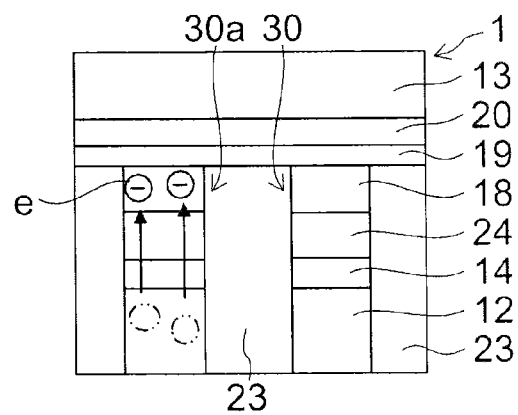
FIG. 8B  WRITE
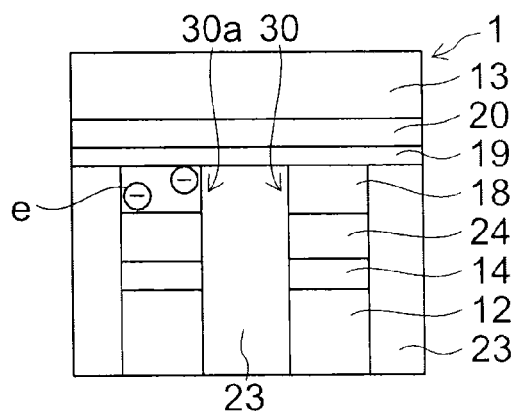
FIG. 8C  READ
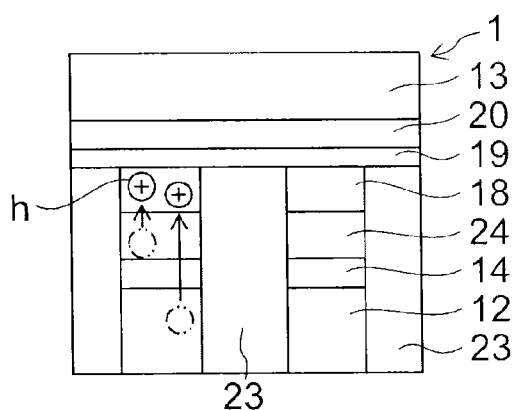
FIG. 8D  ERASE

WRITE

ERASE

WRITE

ERASE

IPD: SiO$_2$ LAYER (4.4nm)/AlO$_x$ LAYER (7.0nm)

WRITE

ERASE

IPD: SiO$_2$ LAYER (5.5nm)/HfO$_x$ LAYER (5.5nm)

WRITE

POTENTIAL OF CONTROL ELECTRODE

ERASE

POTENTIAL OF CONTROL ELECTRODE

IPD: $HfO_x$ LAYER (5.5nm)/ $SiO_2$ LAYER (4.2nm)/ $HfO_x$ LAYER (5.5nm)

SEMICONDUCTOR MEMORY DEVICE AND METHOD FOR MANUFACTURING SAME

CROSS-REFERENCE TO RELATED APPLICATIONS

This application is based upon and claims the benefit of priority from the prior U.S. Provisional Patent Application 61/770,018, filed on Feb. 27, 2013; the entire contents of which are incorporated herein by reference.

FIELD

Embodiments described herein relate generally to a semiconductor memory device and a method for manufacturing the same.

BACKGROUND

Conventionally, NAND flash memories have been developed as nonvolatile semiconductor memory devices. Conventional NAND flash memories adopt what is called the rocket type structure in which the floating electrode protrudes upward. In the rocket type, in order to enhance the controlling power of the control electrode, the control electrode is placed not only on the floating electrode but also between the floating electrodes.

When miniaturization is pursued in the rocket type NAND flash memory, interference occurs between the adjacent memory cell transistors, and malfunctions are made more likely to occur. Furthermore, because of the increase of aspect ratio, processing for inserting the control electrode between the floating electrodes is made difficult. Thus, what is called the flat type structure can be considered. In the configuration of the NAND flash memory of the flat type structure, the interelectrode insulating layer is formed flat, and the control electrode is not inserted between the floating electrodes.

However, in the flat type NAND flash memory, the problem is that the controlling power of the control electrode is weak, and it is difficult to apply an electric field having a sufficient intensity between the active area and the floating electrode. This decreases the amount of charge that can be accumulated in the floating electrode. Thus, the variation of threshold cannot be sufficiently ensured. Furthermore, if the floating electrode is thinned to enhance the applied electric field, activation of polycrystalline silicon constituting the floating electrode is made difficult. Thus, the floating electrode is made less likely to trap electrons. In this context, there is proposed a technique in which a charge trap layer for trapping electrons is provided on the floating electrode independently of the floating electrode.

BRIEF DESCRIPTION OF THE DRAWINGS

FIG. 3 shows a result analyzed from a tunnel layer side;

FIG. 4 shows a result analyzed from an AlO layer side;

FIGS. 5A and 5B are process sectional views illustrating the method for manufacturing a semiconductor device according to the embodiment;

FIGS. 8A to 8D are schematic sectional views illustrating the operation of the semiconductor memory device according to the embodiment, FIG. 8A shows the non-operating state, FIG. 8B shows the write operation, FIG. 8C shows the read operation, and FIG. 8D shows the erase operation;

FIG. 9A shows the write operation time, and FIG. 9B shows the erase operation time;

DETAILED DESCRIPTION

According to one embodiment, a semiconductor memory device includes a semiconductor member, a first insulating layer provided on the semiconductor member, a TaN layer provided on the first insulating layer and containing tantalum and nitrogen, a TaSiN layer provided on the TaN layer in contact with the TaN layer and containing tantalum, silicon, and nitrogen, a second insulating layer provided on the TaSiN layer in contact with the TaSiN layer and containing oxygen, and a control electrode provided on the second insulating layer.

According to one embodiment, a semiconductor memory device includes a semiconductor member, a first insulating layer provided on the semiconductor member, a Ta-containing layer provided on the first insulating layer and containing tantalum, silicon and nitrogen, a second insulating layer provided on the Ta-containing layer and containing oxygen, and a control electrode provided on the second insulating layer. In a concentration profile indicating relationship between vertical position in the Ta-containing layer and concentration of each element, a silicon peak and a nitrogen peak are located inside a tantalum peak.

According to one embodiment, a method for manufacturing a semiconductor memory device includes depositing a TaN layer containing tantalum and nitrogen on a first insulating layer provided on a semiconductor member, depositing a SiN layer containing silicon and nitrogen on the TaN layer, depositing a SiO layer containing silicon and oxygen on the SiN layer, forming a TaSiN layer containing tantalum, silicon and nitrogen between the TaN layer and the SiO layer by heat treatment, and forming a control electrode on the SiO layer.

Embodiments of the invention will now be described with reference to the drawings.

Figure 1:
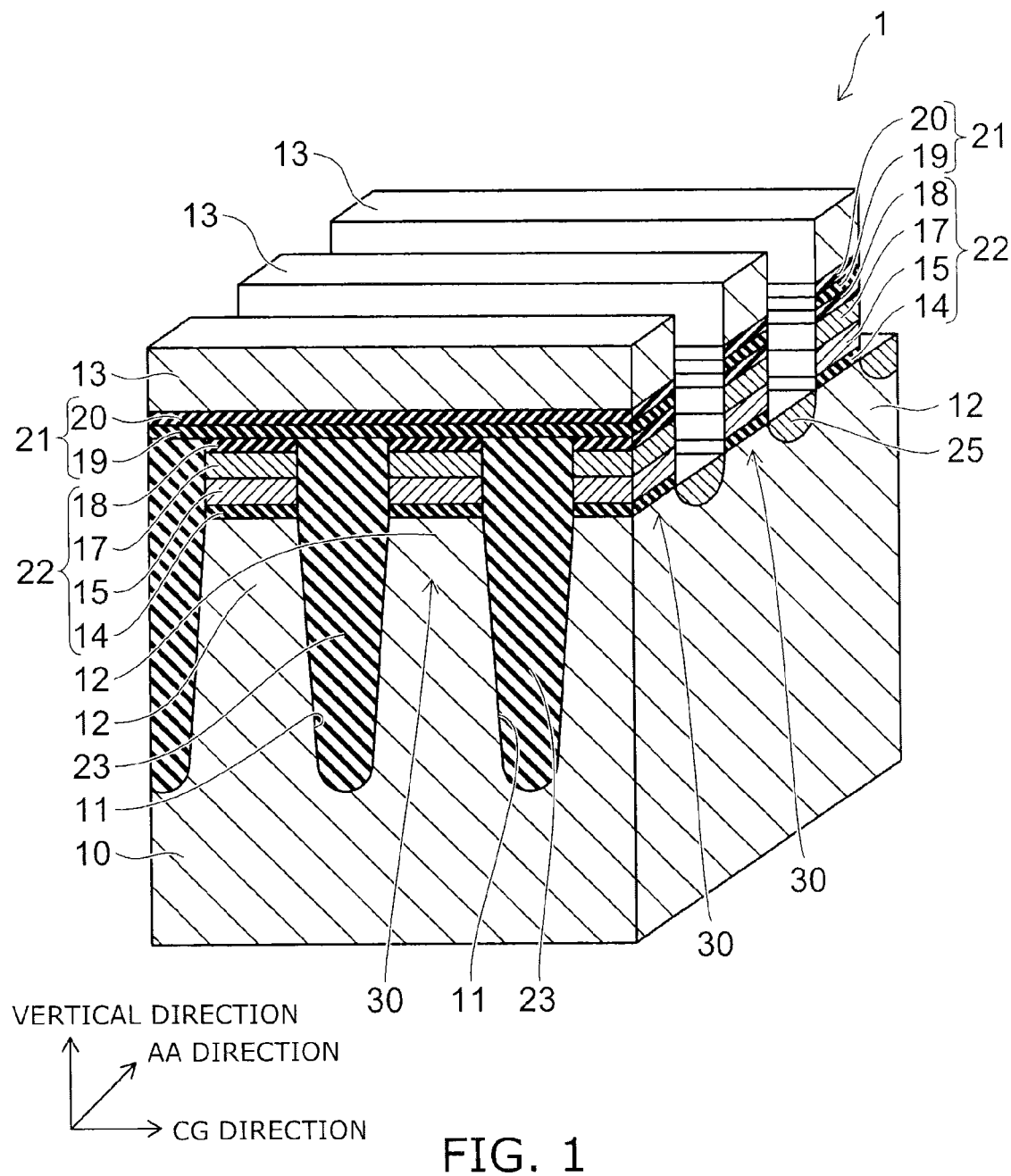
FIG. 1 is a perspective view illustrating a semiconductor memory device according to an embodiment.

FIG. 1 is a perspective view illustrating a semiconductor memory device according to the embodiment.

Figure 2:
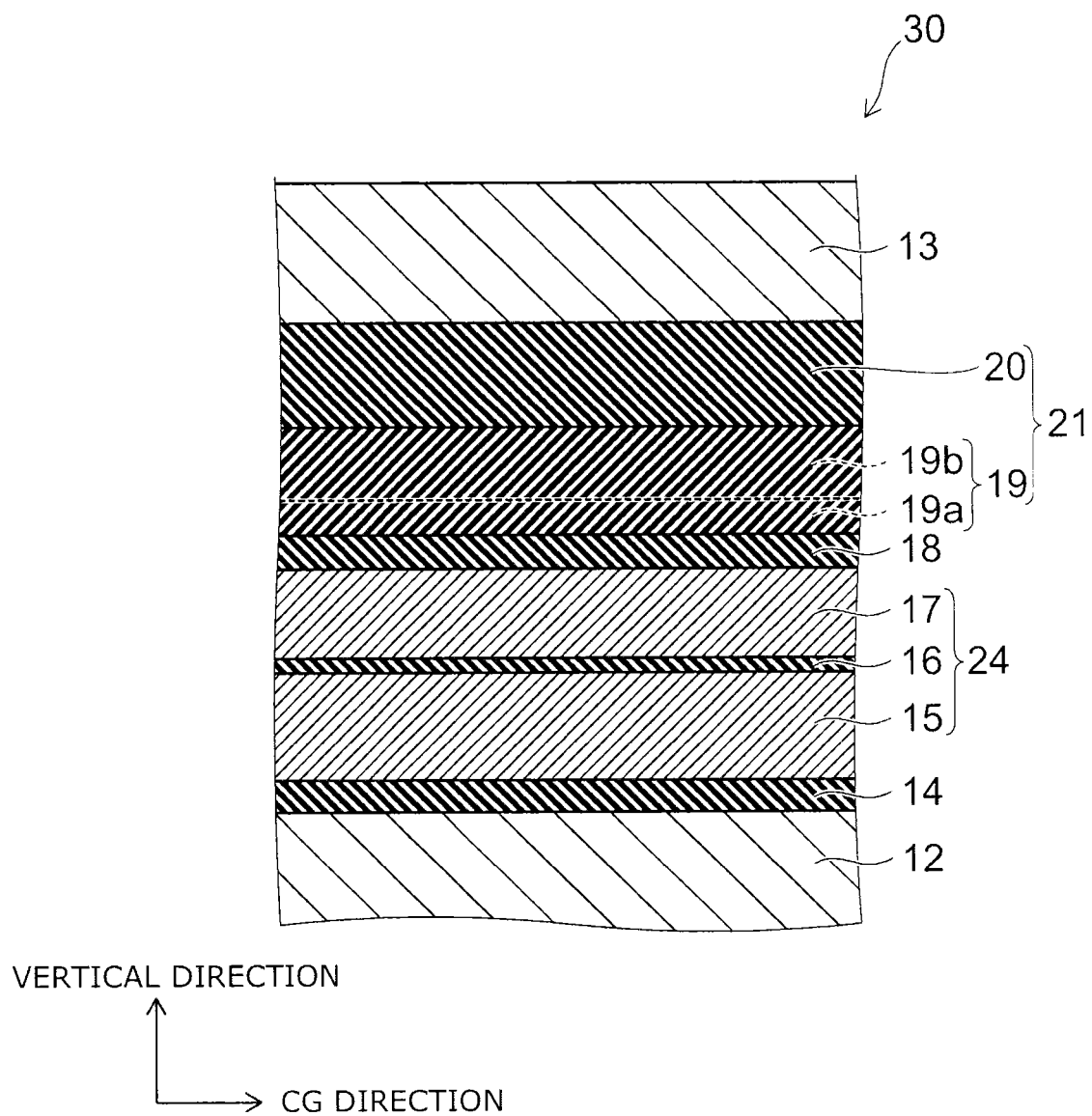
FIG. 2 is a sectional view illustrating a memory cell of the semiconductor memory device according to the embodiment.

FIG. 2 is a sectional view illustrating a memory cell of the semiconductor memory device according to the embodiment.

As shown in FIG. 1, the semiconductor memory device 1 (hereinafter also simply referred to as "device 1") according to the embodiment is a NAND flash memory of the flat cell type. The device 1 includes a silicon substrate 10 made of monocrystalline silicon. In the upper surface of the silicon substrate 10, a plurality of trenches 11 extending in one direction (hereinafter referred to as "AA direction") are formed. The portion between the trenches 11 of the silicon substrate 10 constitutes an active area 12. The active area 12 is doped with impurity serving as e.g. acceptor, and functions as a p-type semiconductor member.

On the silicon substrate 10, a plurality of control electrodes 13 extending in a direction (hereinafter referred to as "CG direction") crossing, such as being orthogonal to, the AA direction are provided. The control electrode 13 is made of metal, and has e.g. a two-layer structure of a tungsten nitride (WN) layer and a tungsten (W) layer. For each closest point of the active area 12 and the control electrode 13, an n-channel memory cell transistor 30 is formed.

As shown in FIG. 2, in each memory cell transistor 30, a tunnel layer 14 made of e.g. silicon oxide is provided on the active area 12. The tunnel layer 14 is a layer being normally insulative, but passing a tunnel current upon application of a prescribed voltage within the driving voltage range of the device 1.

On the tunnel layer 14, a polysilicon layer 15 made of e.g. polycrystalline silicon containing impurity, e.g. boron (B), is provided. The thickness of the polysilicon layer 15 is e.g. 5-10 nm (nanometers), such as 6 nm. On the polysilicon layer 15, a TaO layer 16 made of tantalum oxide ($TaO_x$) is provided. A TaN layer 17 made of tantalum nitride ($TaN_x$) is provided thereon. The thickness of the TaN layer 17 is e.g. 6-10 nm, such as 6 nm. The TaO layer 16 is thinner than the silicon layer 15 and the TaN layer 17. The silicon layer 15, the TaO layer 16, and the TaN layer 17 constitute a floating electrode 24.

On the TaN layer 17, a TaSiN layer 18 containing tantalum (Ta), silicon (Si), and nitrogen (N) is provided. The TaSiN layer 18 functions as a charge trap layer for retaining charge. The thickness of the TaSiN layer 18 is e.g. 2-3 nm.

On the TaSiN layer 18, a SiO layer 19 made of silicon oxide ($SiO_x$) is provided. The oxygen concentration of the lower layer 19a, i.e., the portion on the TaSiN layer side, of the SiO layer 19 is higher than the oxygen concentration of the upper layer 19b of the SiO layer 19. On the SiO layer 19, an AlO layer 20 made of alumina ($Al_2O_3$) is provided. The SiO layer 19 and the AlO layer 20 constitute an IPD (inter-poly dielectric: interelectrode insulating layer) 21. The thickness of the IPD 21 is e.g. 4-8 nm in terms of EOT (equivalent oxide thickness: film thickness converted to $SiO_2$ film).

On the AlO layer 20, the aforementioned control electrode 13 is provided. That is, in each memory cell transistor 30, the active area 12, the tunnel layer 14, the polysilicon layer 15, the TaO layer 16, the TaN layer 17, the TaSiN layer 18, the SiO layer 19, the AlO layer 20, and the control electrode 13 are arranged in this order from the silicon substrate 10 side. The adjacent components are in contact with each other.

As shown in FIG. 1, the stacked body 22 made of the tunnel layer 14, the polysilicon layer 15, the TaO layer 16 (see FIG. 2), the TaN layer 17, and the TaSiN layer 18 is divided like an island for each closest point of the active area 12 and the control electrode 13, i.e., for each memory cell transistor 30. In the trench 11 and between the stacked bodies 22 adjacent in the CG direction, an STI (shallow trench isolation) 23 made of e.g. silicon oxide is embedded.

In contrast, the IPD 21 is divided like a stripe for each directly underlying region of the control electrode 13. The IPD 21 extends in the CG direction so as to link the immediately above regions of a plurality of active areas 12. In the immediately above regions of a plurality of TaSiN layers 18 arranged along the CG direction and in the region therebetween, the upper surface of the IPD 21 is flat. Thus, the control electrode 13 is also flat. In the region of the upper layer portion of the active area 12 between the directly underlying regions of the control electrodes 13, an n-type diffusion layer 25 is formed.

Figure 3:
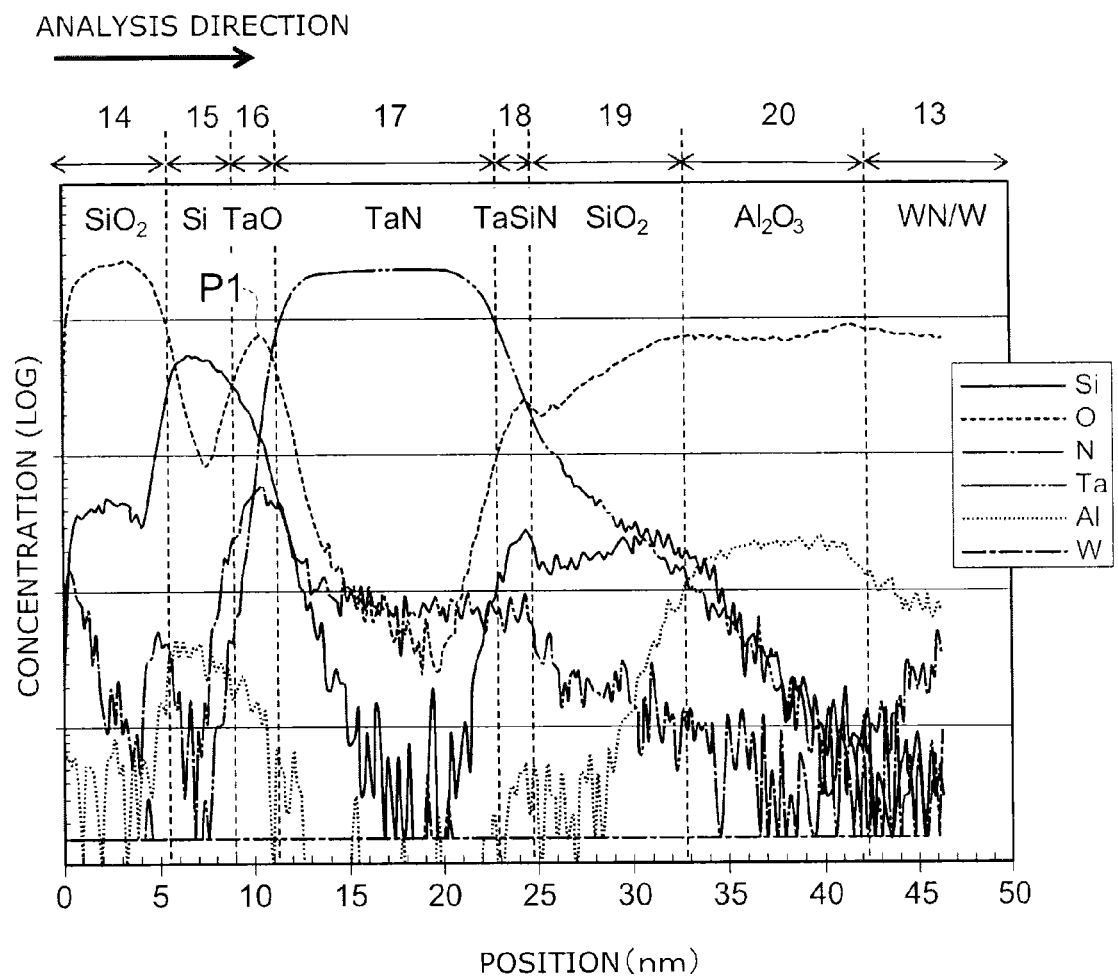
FIG. 3 is a graph illustrating a concentration profile of each element, the horizontal axis represents the position in the vertical direction, the vertical axis represents the concentration of each element.
Figure 4:
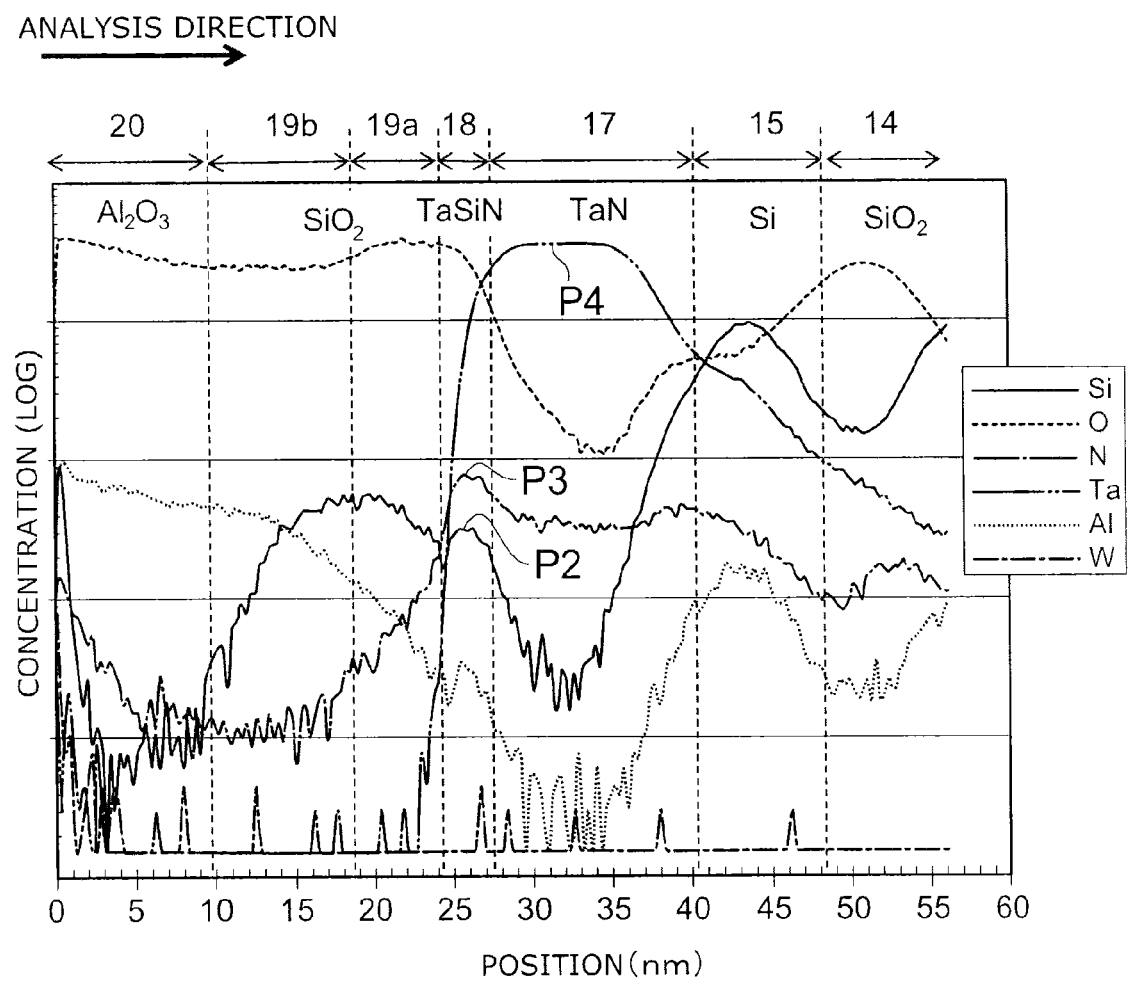
FIG. 4 is a graph illustrating a concentration profile of each element, the horizontal axis represents the position in the vertical direction, the vertical axis represents the concentration of each element.

FIGS. 3 and 4 are graphs illustrating the concentration profile of each element. The horizontal axis represents the position in the vertical direction, and the vertical axis represents the concentration of each element.

Here, the "vertical direction" is the direction orthogonal to both the AA direction and the CG direction.

In FIGS. 3 and 4, a typical composition of each layer is shown for convenience. However, the composition of each layer is not limited thereto.

FIG. 3 shows a result in which the stacked body from the tunnel layer 14 to the control electrode 13 is analyzed from the tunnel layer 14 side. FIG. 4 shows a result in which the stacked body from the tunnel layer 14 to the AlO layer 20 is analyzed from the AlO layer 20 side. In this analysis, removal of the sample surface by ion sputtering and elemental analysis of the surface by SIMS (secondary ionization mass spectrometer) are alternately performed to measure the vertical concentration variation of each element.

Here, in analysis, the element existing in the surface layer of the sample is pushed into the sample by ions for sputtering. Thus, part of the element is detected at a position shifted from the original position of the element toward the target of the analysis direction, i.e., at a position analyzed later. Accordingly, the concentration profile shown in FIG. 3 is not in complete agreement with the concentration profile shown in FIG. 4. In general, the analysis result of the portion analyzed at an earlier timing is more reliable.

As shown in FIG. 3, between the polysilicon layer 15 and the TaN layer 17, a peak P1 of the oxygen profile indicating the presence of the TaO layer 16 is observed. In the region where the peak P1 is observed, the concentration of tantalum (Ta) is also high.

As shown in FIG. 4, between the TaN layer 17 and the SiO layer 19, a peak P2 of the silicon profile and a peak P3 of the nitrogen profile indicating the presence of the TaSiN layer 18 are observed. In the region where the peaks P2 and P3 are observed, the concentration of tantalum is also high. The silicon peak P2 and the nitrogen peak P3 are located inside the peak P4 of the tantalum profile.

In other words, suppose that the TaN layer 17 and the TaSiN layer 18 are regarded as a single Ta-containing layer containing tantalum, silicon, and nitrogen. Then, in the concentration distribution profile (see FIG. 4) showing the relationship between the vertical position and the concentration of each element in this Ta-containing layer, the silicon peak P2 and the nitrogen peak P3 are located inside the tantalum peak P4. More specifically, the silicon peak P2 and the nitrogen peak P3 are located in the end portion on the SiO layer 19 side of the tantalum peak P4.

As shown in FIG. 4, the oxygen concentration of the lower layer 19a placed on the TaSiN layer 18 side of the SiO layer 19 is higher than the oxygen concentration of the upper layer 19b placed on the control electrode 13 side of the SiO layer 19. That is, the lower layer 19a of the SiO layer 19 in contact with the TaSiN layer 18 is an oxygen-rich layer. Furthermore, the nitrogen concentration of the lower layer 19a placed on the TaSiN layer 18 side of the SiO layer 19 is higher than the nitrogen concentration of the upper layer 19b placed on the control electrode 13 side of the SiO layer 19.

As shown in FIG. 3, in the polysilicon layer 15, aluminum (Al) with a smaller amount than silicon (Si) exists. On the other hand, in the tunnel layer 14, aluminum scarcely exists. The reason for this is considered as follows. The polysilicon layer 15 containing boron serves as a diffusion prevention layer against aluminum in the AlO layer 20, and prevents aluminum from penetrating into the tunnel layer 14 and the active area 12.

Next, a method for manufacturing a semiconductor memory device according to the embodiment is described.

FIGS. 5A and 5B, 6A and 6B, and 7A and 7B are process sectional views illustrating the method for manufacturing a semiconductor device according to the embodiment.

First, as shown in FIG. 5A, a silicon substrate 10 made of monocrystalline silicon is prepared. In the silicon substrate 10, at least an upper layer portion is of p-type. Next, by e.g. thermal oxidation technique, a tunnel layer 14 made of silicon oxide is formed on the upper surface of the silicon substrate 10. Next, by depositing silicon with impurity, a polysilicon layer 15 is formed. At this time, a natural oxide film 41 is formed on the upper surface of the polysilicon layer 15.

Next, as shown in FIG. 5B, tantalum and nitrogen are deposited to form a TaN layer 17 made of tantalum nitride. At this time, the deposited tantalum is combined with oxygen in the natural oxide film 41, and thereby silicon in the natural oxide film 41 is reduced. As a result, a TaO layer 16 made of tantalum oxide is formed between the polysilicon layer 15 and the TaN layer 17. Next, silicon nitride is deposited to form a SiN layer 42 on the TaN layer 17. The thickness of the SiN layer 42 is set to e.g. 1.5-2.5 nm, such as 2.0 nm.

Figure 6A:
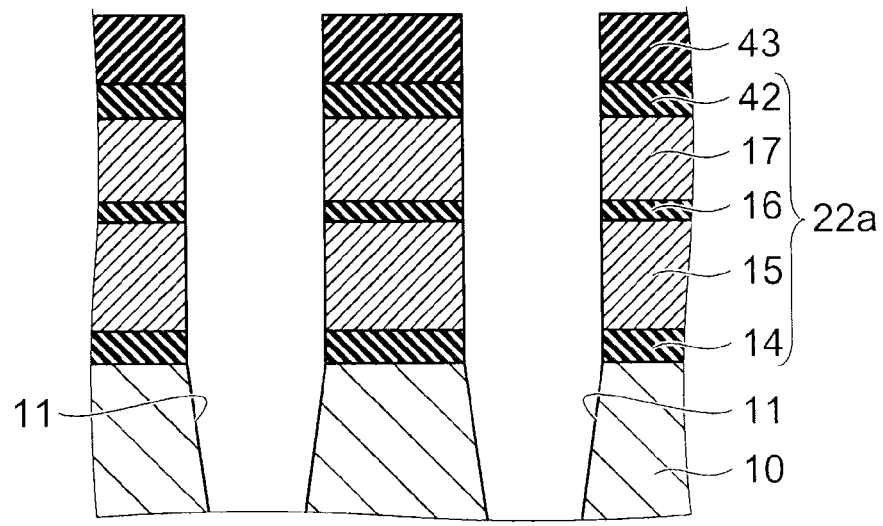
FIGS. 6A and 6B are process sectional views illustrating the method for manufacturing the semiconductor device according to the embodiment.

Next, as shown in FIG. 6A, a striped hard mask 43 extending in the AA direction is formed on the SiN layer 42. Next, the hard mask 43 is used as a mask to perform etching. Thus, the stacked body 22a made of the tunnel layer 14, the polysilicon layer 15, the TaO layer 16, the TaN layer 17, and the SiN layer 42 is divided into stripes extending in the AA direction. Simultaneously, a plurality of trenches 11 extending in the AA direction are formed in the upper layer portion of the silicon substrate 10. At this time, the portion between the trenches 11 in the upper layer portion of the silicon substrate 10 constitutes an active area 12.

Figure 6B:
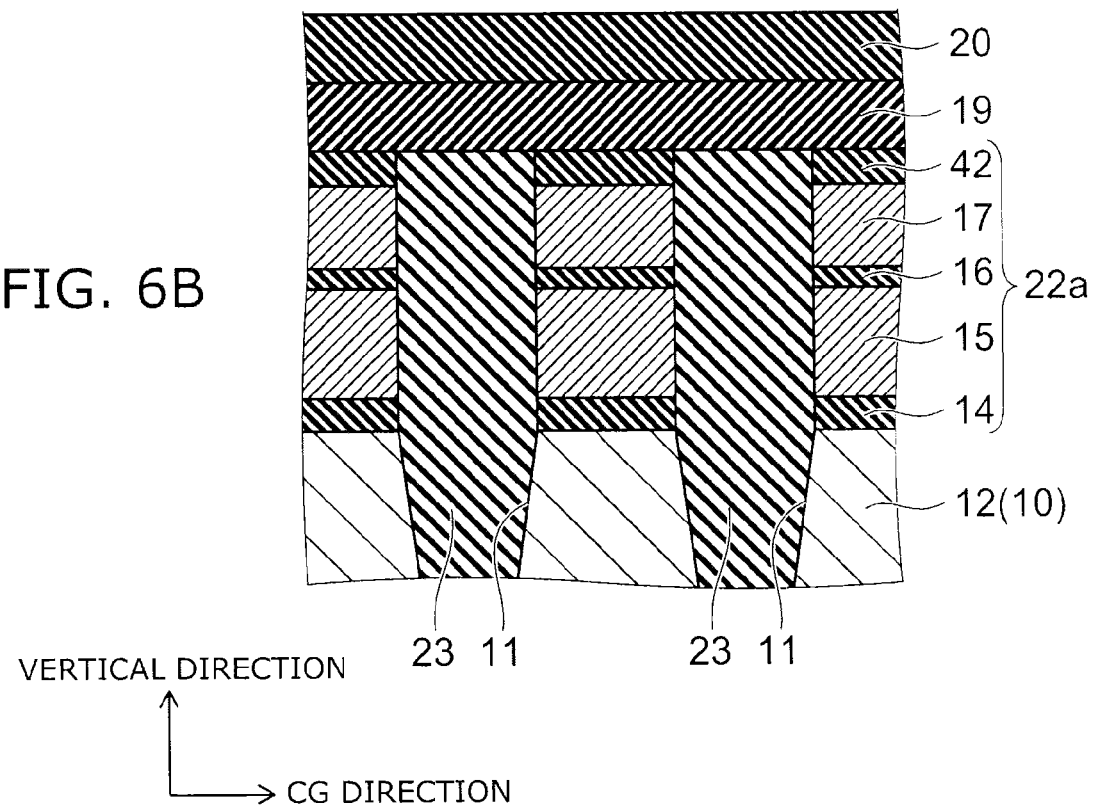

Next, as shown in FIG. 6B, silicon oxide is deposited and embedded into the trench 11 and between the stacked bodies 22a. Next, by planarization processing on the upper surface, the hard mask 43 is removed, and the SiN layer 42 is exposed. Thus, an STI 23 made of silicon oxide is formed in the trench 11 and between the stacked bodies 22a. Next, a SiO layer 19 made of silicon oxide is formed above the stacked body 22a and the STI 23. Next, an AlO layer 20 made of aluminum oxide is formed.

Figure 7A:
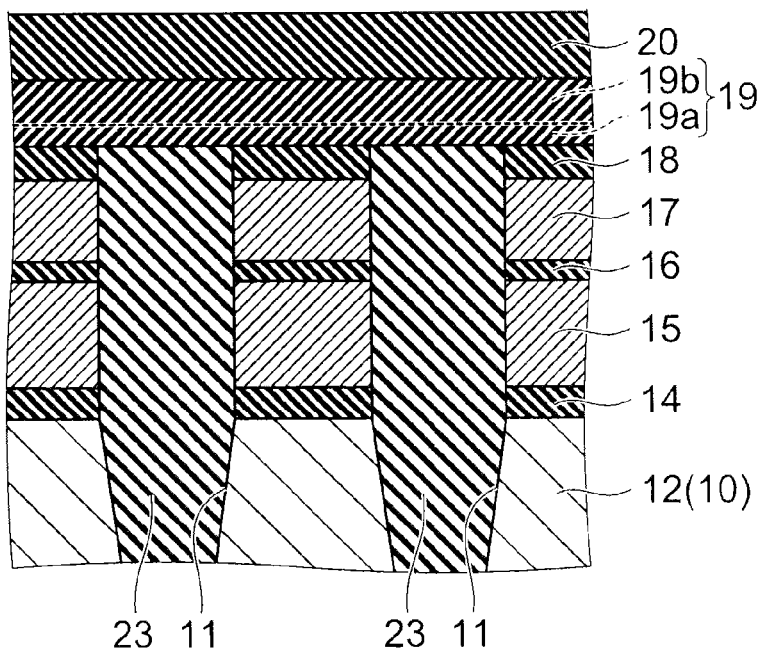
FIGS. 7A and 7B are process sectional views illustrating the method for manufacturing the semiconductor device according to the embodiment.

Next, as shown in FIG. 7A, heat treatment is performed. This heat treatment is performed in a non-oxidizing atmosphere, e.g., a nitrogen atmosphere. The temperature is set to e.g. 850-1035° C., and the time is set to e.g. 10-30 seconds. In an example, the temperature is set to 900° C., and the time is set to 30 seconds. Thus, the TaN layer 17, the SiN layer 42, and the SiO layer 19 react.

Tantalum in the TaN layer 17 is diffused into the SiN layer 42 to form a TaSiN layer 18 containing tantalum, silicon, and nitrogen. Furthermore, part of silicon in the lower layer 19a of the SiO layer 19 is introduced into the TaSiN layer 18. This makes the lower layer 19a oxygen-rich. Furthermore, nitrogen in the SiN layer 42 is diffused into the SiO layer 19. Thus, nitrogen is contained in the SiO layer 19. The nitrogen concentration of the lower layer 19a is made higher than the nitrogen concentration of the upper layer 19b. At this time, the TaO layer 16 is interposed between the polysilicon layer 15 and the TaN layer 17. This TaO layer 16 functions as a diffusion prevention layer against silicon. Thus, no TaSiN layer is formed between the polysilicon layer 15 and the TaN layer 17.

Figure 7B:
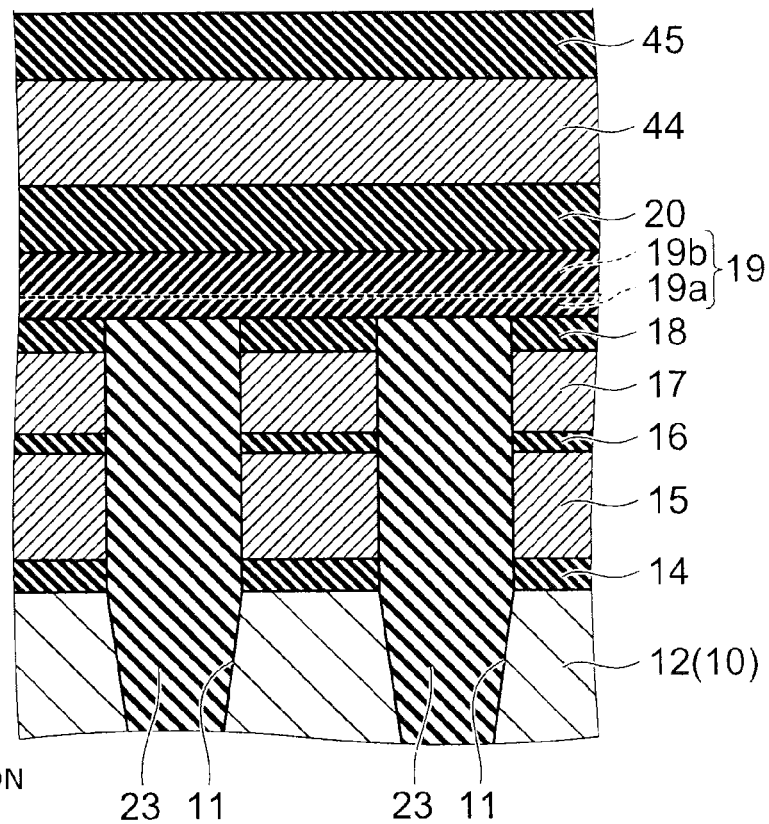

Next, as shown in FIG. 7B, tungsten nitride (WN) is deposited, and tungsten (W) is deposited to form a conductive film 44. Next, a plurality of hard masks 45 extending in the CG direction are formed.

Next, as shown in FIG. 1, by etching using the hard masks 45 (see FIG. 7B) as a mask, the conductive film 44 is processed into control electrodes 13. Next, by etching using the hard masks 45 and the control electrodes 13 as a mask, the AlO layer 20, the SiO layer 19, the TaSiN layer 18, the TaN layer 17, the TaO layer 16, the polysilicon layer 15, and the tunnel layer 14, and the STI 23 are selectively removed and processed into stripes extending in the CG direction. At this time, the TaSiN layer 18, the TaN layer 17, the TaO layer 16, the polysilicon layer 15, and the tunnel layer 14 are divided along both the AA direction and the CG direction and shaped like islands.

Next, the hard masks 45 and the control electrodes 13 are used as a mask to perform ion implantation of impurity serving as donor. Thus, an n-type diffusion layer 25 is formed in the region of the upper layer portion of the active area 12 between the directly underlying regions of the control electrodes 13. Then, the hard masks 45 are removed. Thus, the semiconductor memory device 1 shown in FIGS. 1 and 2 is manufactured.

Next, the operation principle of the semiconductor memory device 1 according to the embodiment is described.

FIGS. 8A to 8D are schematic sectional views illustrating the operation of the semiconductor memory device according to the embodiment. FIG. 8A shows the non-operating state. FIG. 8B shows the write operation. FIG. 8C shows the read operation. FIG. 8D shows the erase operation.

Figure 9A:
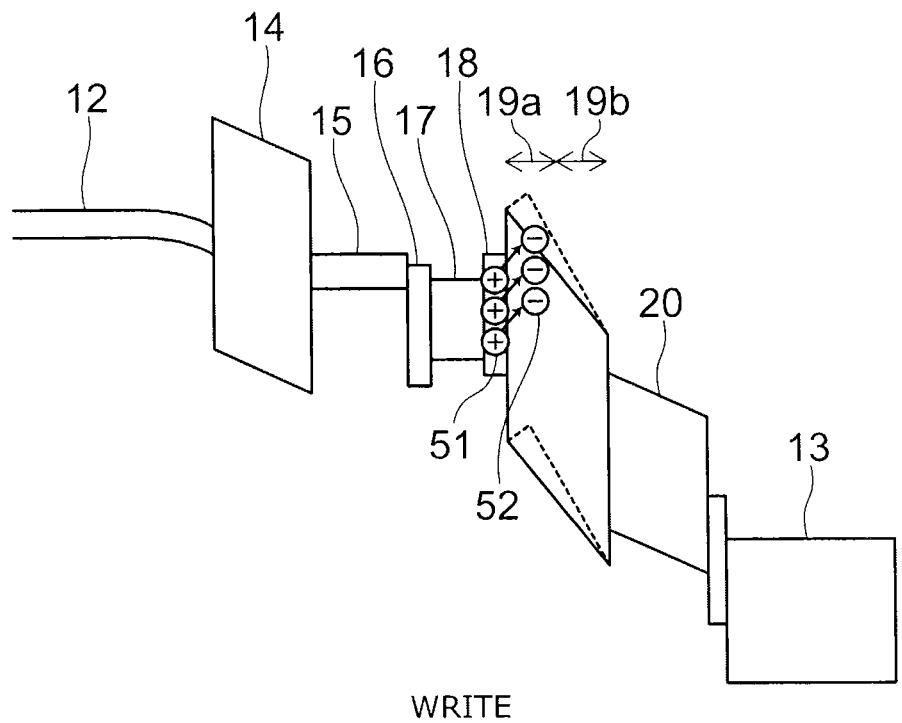
FIGS. 9A and 9B show the band structures of a memory cell transistor of the semiconductor memory device according to the embodiment.
Figure 9B:
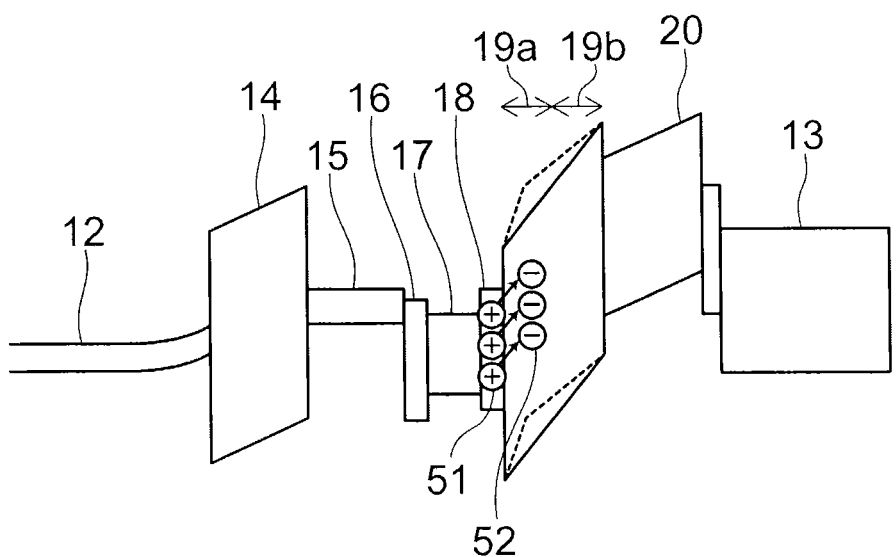

FIGS. 9A and 9B show the band structures of a memory cell transistor of the semiconductor memory device according to the embodiment. FIG. 9A shows the write operation time. FIG. 9B shows the erase operation time.

As shown in FIG. 8A, in the non-operating state of the device 1, positive fixed charge 51 is generated in the TaSiN layer 18. Data indicating the generation of positive fixed charge in the TaSiN layer 18 will be described later in the first test example. In the lower layer 19a (see FIG. 2) of the SiO layer 19, the composition of silicon oxide ($SiO_x$) is made oxygen-rich, and oxygen ions ($O^{2-}$) exist excessively. Thus, negative fixed charge 52 exists in the lower layer 19a. The positive fixed charge 51 and the negative fixed charge 52 form a dipole. As a result, the positive fixed charge 51 and the negative fixed charge 52 are stabilized.

The positive fixed charge 51 and the negative fixed charge 52 affect the operation of the device 1. In the following, the influence of fixed charge exerted on each operation of the device 1 is described. In FIGS. 8B to 8D, for clarity of illustration, the positive fixed charge 51 and the negative fixed charge 52 are not shown. Furthermore, the polysilicon layer 15, the TaO layer 16, and the TaN layer 17 are depicted as a floating electrode 24.

As shown in FIG. 8B, in writing data to a certain memory cell transistor 30 (hereinafter referred to as "selected cell 30a"), a relatively positive potential is applied to the control electrode 13 connected to the selected cell 30a, and a relatively negative potential is applied to the active area 12 connected to the selected cell 30a. Thus, in the selected cell 30a, electrons e are injected from the active area 12 through the tunnel layer 14 and the floating electrode 24 into the TaSiN layer 18 serving as a charge trap layer. This shifts the threshold of the selected cell 30a, and data can be written thereto.

At this time, as shown in FIG. 9A, for electrons e, the potential of the TaSiN layer 18 is lowered by the positive fixed charge 51. This increases the saturated amount of electrons that can be accumulated in the TaSiN layer 18. Furthermore, electrons e approach the dipole from the positive pole side. Thus, electrons e are attracted to the positive fixed charge 51 and likely to be injected into the TaSiN layer 18. Thus, a large amount of electrons e can be injected from the active area 12 into the TaSiN layer 18. On the other hand, as shown by the dashed line, the potential of the lower layer 19a of the SiO layer 19 is raised by the negative fixed charge 52. This heightens the electron barrier of the SiO layer 19, and can suppress that electrons e punch through the SiO layer 19 and flow out to the control electrode 13. As a result, the device 1 has high efficiency in write operation.

As shown in FIG. 8C, electrons e injected into the TaSiN layer 18 of the selected cell 30a are attracted by the positive fixed charge 51 (see FIG. 8A), and hence are stably retained in the TaSiN layer 18. Furthermore, the positive fixed charge 51 is stably fixed by the negative fixed charge 52. Moreover, that the electrons e retained in the TaSiN layer 18 leak through the IPD 21 to the control electrode 13 is suppressed by the negative fixed charge 52 fixed to the SiO layer 19. Thus, the selected cell 30a can stably retain the electrons e. That is, the device 1 has good data retention capability. In this state, by detecting the threshold of the selected cell 30a, the data stored in the selected cell 30a can be read.

As shown in FIG. 8D, in erasing the data written to the selected cell 30a, a relatively negative potential is applied to the control electrode 13 connected to the selected cell 30a, and a relatively positive potential is applied to the active area 12 connected to the selected cell 30a. Thus, holes h are injected from the floating electrode 24 into the TaSiN layer 18 and subjected to pair annihilation with electrons e accumulated in the TaSiN layer 18. Furthermore, by ejection of holes h from the floating electrode 24, the floating electrode 24 is depleted. Thus, holes h are injected also from the active area 12 through the floating electrode 24 into the TaSiN layer 18 and subjected to pair annihilation with the electrons e in the TaSiN layer 18. Thus, by annihilating electrons e accumulated in the TaSiN layer 18, data can be erased.

At this time, as shown by the dashed line in FIG. 9B, due to the existence of the negative fixed charge 52, for electrons e, the potential of the lower layer 19a of the SiO layer 19 is increased. Thus, electrons are less likely to be injected from the control electrode 13 into the TaSiN layer 18. Accordingly, electrons can be efficiently removed from the TaSiN layer 18. Hence, the device 1 has high efficiency in erase operation of data.

Thus, in the semiconductor memory device 1 according to the embodiment, a dipole is formed near the interface between the TaSiN layer 18 and the SiO layer 19. Accordingly, even in the structure of the flat cell type in which the control electrode 13 is not inserted between the floating electrodes 24, the device has high efficiency in write operation and erase operation, and good charge retention characteristics.

Furthermore, in the semiconductor memory device 1 according to the embodiment, because the flat cell structure is adopted, there is no case where the portion of the control electrode 13 inserted between the floating electrodes 24 affects a non-selected cell neighboring the selected cell. This can weaken the interaction between the memory cell transistors 30. Moreover, because the device 1 adopts the flat cell structure, there is no need to insert part of the control electrode 13 between the floating electrodes 24. This facilitates manufacturing despite miniaturization.

In the example illustrated in the embodiment, the IPD 21 is composed of the SiO layer 19 and the AlO layer 20. However, the embodiment is not limited thereto. The IPD 21 only needs to be an insulating layer containing oxygen (O). Preferably, the IPD 21 is a layer made of e.g. metal oxide or semimetal oxide. More preferably, the IPD 21 is a layer including e.g. an oxide of one or more elements selected from the group consisting of silicon, hafnium, and aluminum. For instance, as shown in the second test example described later, the IPD 21 may be a two-layer film in which a hafnia layer ($HfO_x$ layer) is formed on a silicon oxide layer ($SiO_2$ layer). Alternatively, the IPD 21 may be a three-layer film in which a hafnia layer ($HfO_x$ layer), a silicon oxide layer ($SiO_2$ layer), and a hafnia layer ($HfO_x$ layer) are stacked in this order. Alternatively, the IPD 21 may be a monolayer silicon oxide layer, a monolayer alumina layer, or a monolayer hafnia layer. In order to reduce the physical thickness while ensuring the electrical film thickness (EOT), the permittivity of the IPD is preferably 9 or more.

FIRST TEXT EXAMPLE

The first test example will describe data indicating that positive fixed charge 51 is generated in the TaSiN layer 18.

Figure 10:
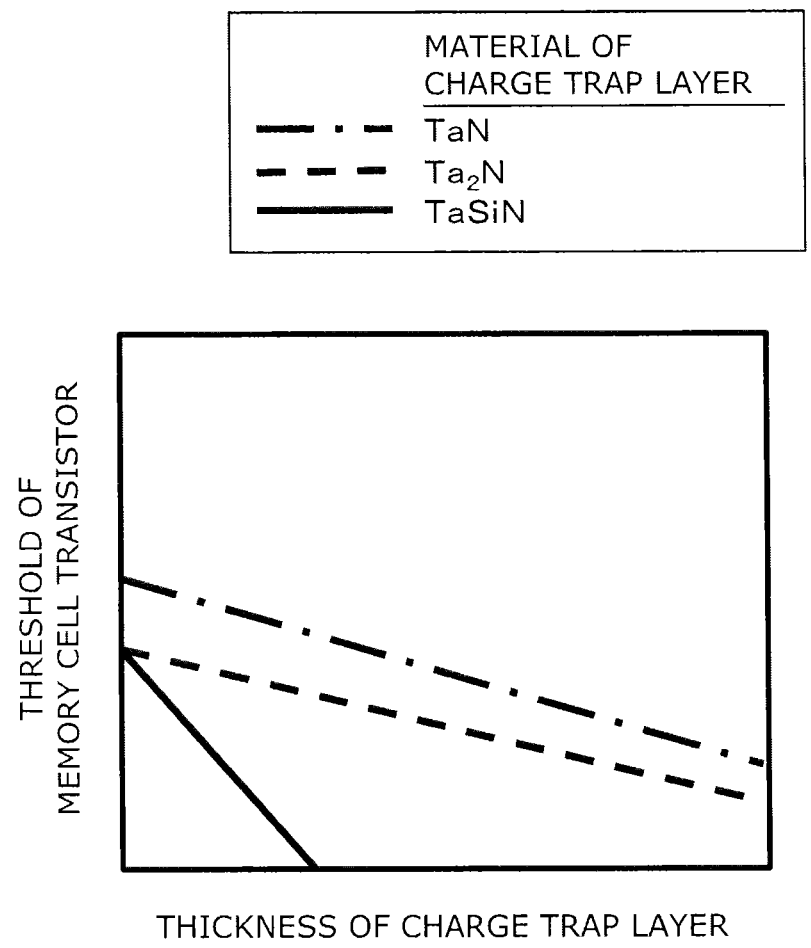
FIG. 10 is a graph illustrating the influence of the material of the charge trap layer exerted on the shift amount of the threshold, the horizontal axis represents the thickness of the charge trap layer, and the vertical axis represents the threshold of the memory cell transistor.

FIG. 10 is a graph illustrating the influence of the material of the charge trap layer exerted on the shift amount of the threshold. The horizontal axis represents the thickness of the charge trap layer. The vertical axis represents the threshold of the memory cell transistor.

As shown in FIG. 10, in the case of forming the charge trap layer from TaSiN, with the increase of the thickness of the charge trap layer, the threshold of the n-type memory cell transistor was decreased. Thus, it is considered that positive fixed charge is generated in the TaSiN layer. Furthermore, the decreased amount of the threshold in the case of forming the charge trap layer from TaSiN was larger than the decreased amount of the threshold in the case of forming the charge trap layer from TaN or $Ta_2N$. Thus, it is considered that the amount of positive fixed charge generated in the TaSiN layer is larger than the amount of positive fixed charge generated in the TaN layer and the $Ta_2N$ layer.

SECOND TEST EXAMPLE

In the second test example, the effect of forming a TaN layer 17 made of tantalum nitride on the polysilicon layer 15 in the step shown in FIG. 5B is described in comparison with the case of forming a TiN layer made of titanium nitride instead of the TaN layer 17.

Figures 11A, 11B:
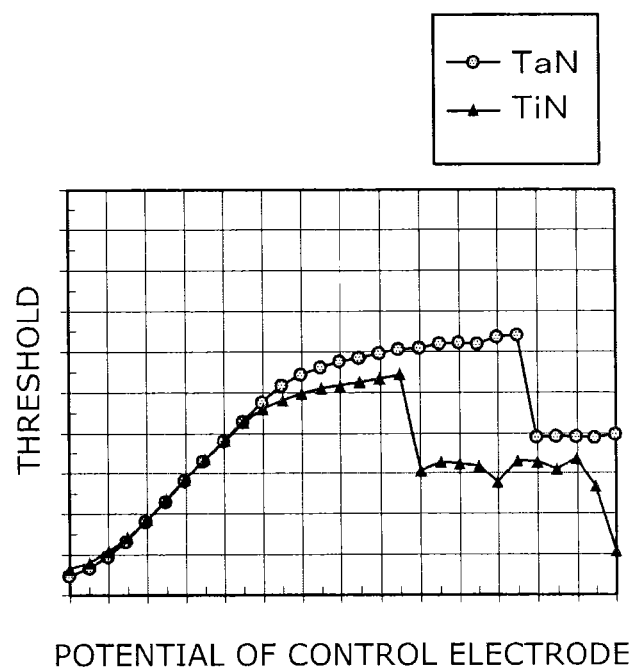
FIGS. 11A and 11B are graphs illustrating the relationship between the gate potential and the threshold, the horizontal axis represents the potential of the control electrode, and the vertical axis represents the threshold of the memory cell transistor.
Figure 12A:
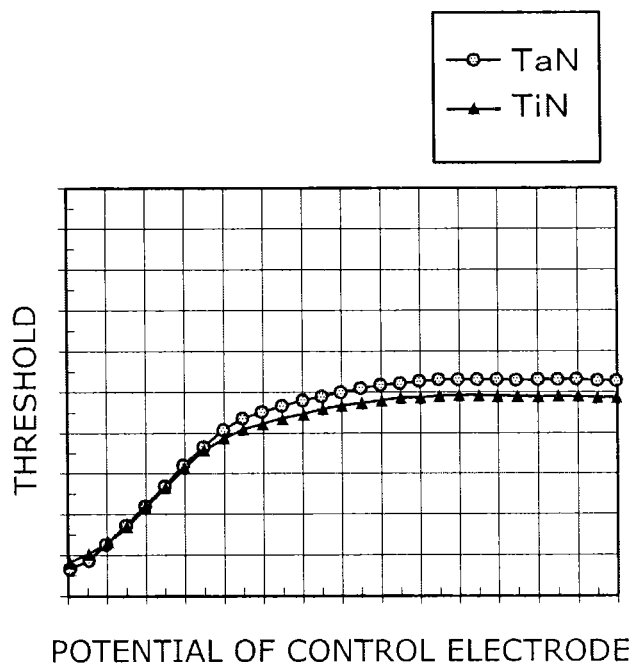
FIGS. 12A and 12B are graphs illustrating the relationship between the gate potential and the threshold, the horizontal axis represents the potential of the control electrode, and the vertical axis represents the threshold of the memory cell transistor.
Figure 13A:
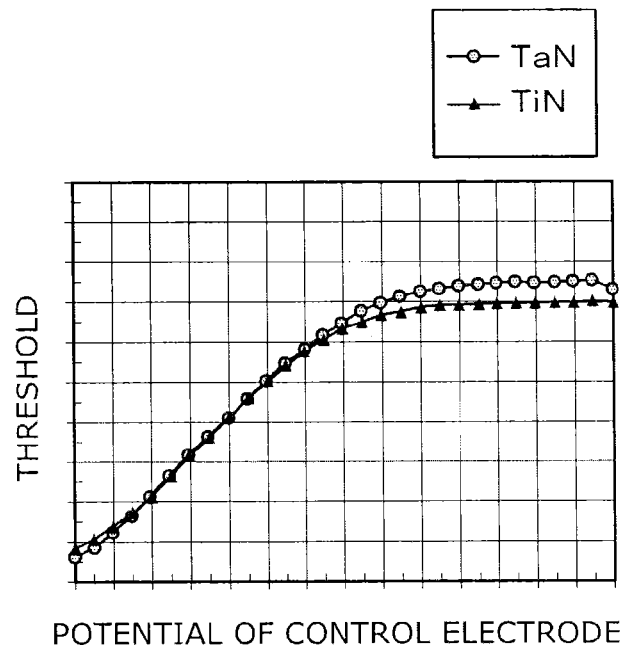
FIGS. 13A and 13B are graphs illustrating the relationship between the gate potential and the threshold, the horizontal axis represents the potential of the control electrode, and the vertical axis represents the threshold of the memory cell transistor.

FIGS. 11A, 12A, and 13A are graphs illustrating the relationship between the gate potential and the threshold in write operation. The horizontal axis represents the potential of the control electrode. The vertical axis represents the threshold of the memory cell transistor.

Figure 12B:
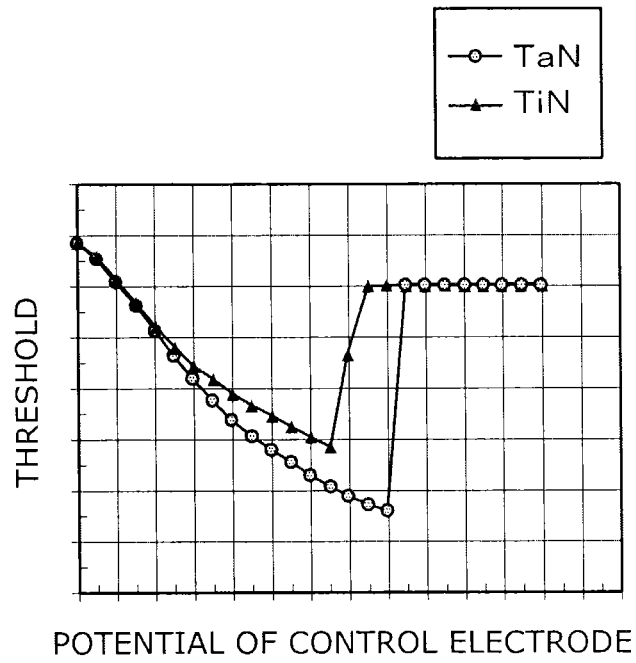
Figure 13B:
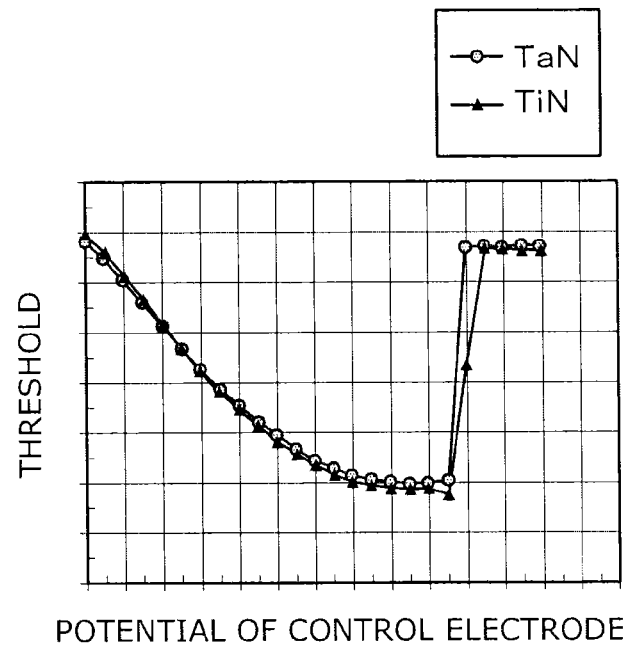

FIGS. 11B, 12B, and 13B are graphs illustrating the relationship between the gate potential and the threshold in erase operation. The horizontal axis represents the potential of the control electrode. The vertical axis represents the threshold of the memory cell transistor.

FIGS. 11A and 11B show an example of the IPD made of a two-layer film in which an alumina layer ($AlO_x$ layer) having a thickness of 7.0 nm is stacked on a silicon oxide layer ($SiO_2$ layer) having a thickness of 4.4 nm.

FIGS. 12A and 12B show an example of the IPD made of a two-layer film in which a hafnia layer ($HfO_x$ layer) having a thickness of 5.5 nm is stacked on a silicon oxide layer ($SiO_2$ layer) having a thickness of 5.5 nm.

FIGS. 13A and 13B show an example of the IPD made of a three-layer film in which a hafnia layer ($HfO_x$ layer) having a thickness of 5.5 nm, a silicon oxide layer ($SiO_2$ layer) having a thickness of 4.2 nm, and a hafnia layer ($HfO_x$ layer) having a thickness of 5.5 nm are stacked in this order.

As shown in FIGS. 11A and 11B and FIGS. 12A and 12B, in the case of the IPD made of a $SiO_2/AlO_x$ two-layer film and the case of the IPD made of a $SiO_2/HfO_x$ two-layer film, in both of write operation and erase operation, the variation of threshold was larger in the case of forming a TaN layer on the polysilicon layer 15 than in the case of forming a TiN layer. Furthermore, as shown in FIGS. 13A and 13B, in the case of the IPD made of a $HfO_x/SiO_2/HfO_x$ three-layer film, in write operation, the variation of threshold was larger in the case of forming a TaN layer on the polysilicon layer 15 than in the case of forming a TiN layer. In erase operation, the variation of threshold was comparable.

In general, the effect of the charge trap layer is determined by the work function of the material. As the work function becomes higher, the potential for electrons becomes deeper. It is considered that this makes writing easier and erasure more difficult. The work function of TiN is 4.6 eV. This is higher than the work function of TaN, 4.4 eV. Thus, it is supposed that the sample formed with a TiN layer is made easier to write and more difficult to erase than the sample formed with a TaN layer. Accordingly, it is supposed that the variation of threshold at write time is made larger in the sample formed with a TiN layer.

However, as shown in FIGS. 11A, 12A, and 13A, in this test example, in write operation, the threshold variation of the sample formed with a TaN layer was larger than the threshold variation of the sample formed with a TiN layer. Furthermore, as shown in FIGS. 11B, 12B, and 13B, also in erase operation, the threshold variation of the sample formed with a TaN layer was comparable to or larger than the threshold variation of the sample formed with a TiN layer. The reason for this is considered as follows. As described above, in the step shown in FIG. 5B, a TaN layer 17 is formed, and a SiN layer 42 is formed thereon. In the step shown in FIG. 6B, an insulating layer containing oxygen (e.g., SiO layer 19) is formed. In the step shown in FIG. 7A, heat treatment is performed. Thus, a TaSiN layer 18 is formed. Simultaneously, the lower layer 19a of the SiO layer 19 is turned into an oxygen-rich layer, and a dipole is formed.

The embodiment described above can realize a semiconductor memory device being easy to miniaturize and having high write efficiency, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a semiconductor member;
   a first insulating layer provided on the semiconductor member;
   a TaN layer provided on the first insulating layer and containing tantalum and nitrogen;
   a TaSiN layer provided on the TaN layer in contact with the TaN layer and containing tantalum, silicon, and nitrogen;
   a second insulating layer provided on the TaSiN layer in contact with the TaSiN layer and containing oxygen; and
   a control electrode provided on the second insulating layer.

2. The device according to claim 1, further comprising:
   a silicon layer provided between the first insulating layer and the TaN layer and containing silicon.

3. The device according to claim 2, further comprising:
   a TaO layer provided between the silicon layer and the TaN layer and formed from tantalum oxide.

4. The device according to claim 1, wherein the second insulating layer includes an oxide of one or more elements selected from the group consisting of silicon, hafnium and aluminum.

5. The device according to claim 4, wherein a portion on the TaSiN layer side of the second insulating layer is made of silicon oxide.

6. The device according to claim 1, wherein oxygen concentration of a portion on the TaSiN layer side of the second insulating layer is higher than oxygen concentration of a portion on the control electrode side of the second insulating layer.

7. The device according to claim 1, wherein the second insulating layer contains nitrogen, and nitrogen concentration of a portion on the TaSiN side of the second insulating layer is higher than nitrogen concentration of a portion on the control electrode side of the second insulating layer.

8. The device according to claim 1, wherein the TaSiN layer contains a positive fixed charge, and a portion on the TaSiN layer side of the second insulating layer contains a negative fixed charge.

9. The device according to claim 1, wherein
   the second insulating layer includes an oxide of one or more elements selected from the group consisting of hafnium and aluminum, and
   the device further comprises:
   a silicon layer provided between the first insulating layer and the TaN layer and containing silicon and the one or more selected elements with a smaller amount than the silicon.

10. The device according to claim 1, further comprising:
    another semiconductor member;
    another first insulating layer provided on the another semiconductor member; and
    another TaSiN layer provided on the another first insulating layer and containing tantalum, silicon and nitrogen,
    wherein the control electrode is formed flat in an immediately above region of the TaSiN layer, an immediately above region of the another TaSiN layer, and a region between these immediately above regions.

11. The device according to claim 1, wherein the TaSiN layer and the second insulating layer are formed by stacking a SiN layer containing silicon and nitrogen and a SiO layer containing silicon and oxygen in this order on a TaN layer containing tantalum and nitrogen, and then performing heat treatment.

12. A semiconductor memory device comprising:
a semiconductor member;
a first insulating layer provided on the semiconductor member;
a Ta-containing layer provided on the first insulating layer and containing tantalum, silicon and nitrogen;
a second insulating layer provided on the Ta-containing layer and containing oxygen; and
a control electrode provided on the second insulating layer,
in a concentration profile indicating relationship between vertical position in the Ta-containing layer and concentration of each element, a silicon peak and a nitrogen peak being located inside a tantalum peak.

13. The device according to claim 12, wherein the silicon peak and the nitrogen peak are located in an end portion on the second insulating layer side of the tantalum peak.

14. The device according to claim 12, wherein the second insulating layer contains nitrogen, and nitrogen concentration of a portion on the TaSiN side of the second insulating layer is higher than nitrogen concentration of a portion on the control electrode side of the second insulating layer.

15. The device according to claim 12, wherein
the second insulating layer includes an oxide of one or more elements selected from the group consisting of hafnium and aluminum, and
the device further comprises:
a silicon layer provided between the first insulating layer and the Ta-containing layer and containing silicon and the one or more selected elements with a smaller amount than the silicon.

16. The device according to claim 12, wherein a portion on the Ta-containing layer side of the second insulating layer is made of silicon oxide.

17. The device according to claim 12, wherein the Ta-containing layer and the second insulating layer are formed by stacking a SiN layer containing silicon and nitrogen and a SiO layer containing silicon and oxygen in this order on a TaN layer containing tantalum and nitrogen, and then performing heat treatment.

* * * * *